(12) United States Patent
Cho et al.

(10) Patent No.: US 6,566,221 B1
(45) Date of Patent: May 20, 2003

(54) CAPACITOR STRUCTURE AND METHOD FOR FABRICATING THE SAME

(75) Inventors: Bok Won Cho, Chungcheongbuk-do (KR); Byung Jae Choi, Chungcheongbuk-do (KR); Young Il Cheon, Chungcheongbuk-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 09/469,257

(22) Filed: Dec. 22, 1999

(30) Foreign Application Priority Data

Dec. 23, 1998 (KR) .............................. 98/57884

(51) Int. Cl.[7] .............................................. H01L 21/20
(52) U.S. Cl. ...................................... 438/398; 438/396
(58) Field of Search ............................. 438/239, 381, 438/393, 397, 399, 395, 396, 398

(56) References Cited

U.S. PATENT DOCUMENTS

| | | | | |
|---|---|---|---|---|
| 5,981,334 A | * | 11/1999 | Chien et al. | 438/253 |
| 6,077,573 A | * | 6/2000 | Kim et al. | 427/578 |
| 6,103,587 A | * | 8/2000 | Nakabeppu | 438/398 |
| 6,165,830 A | * | 12/2000 | Lin et al. | 438/238 |

* cited by examiner

*Primary Examiner*—Amir Zarabian
*Assistant Examiner*—Pamela Perkins
(74) *Attorney, Agent, or Firm*—Birch, Stewart, Kolasch & Birch, LLP

(57) ABSTRACT

The method for fabricating a capacitor forms a lower electrode of a capacitor over a substrate, adds impurity ions to upper portions of the lateral surfaces; and forms HSG-Si on surfaces of the lower electrode except the upper portions of the lateral surfaces.

13 Claims, 9 Drawing Sheets

CAPACITOR STRUCTURE AND METHOD FOR FABRICATING THE SAME

BACKGROUND OF THE INVENTION

1. Field of the Invention

The present invention relates to a capacitor in a DRAM, and more particularly, to a structure of a lower electrode of a capacitor and a method for fabricating the same.

2. Background of the Related Art

In general with a semiconductor memory becoming highly packed following the development of semiconductor memory from the mega class to the giga class, several methods have been employed for increasing an effective area of a capacitor within a restricted area of a cell in the semiconductor memory.

In one method, the effective area of the capacitor is increased by forming a three dimensional storage node, such as a trench type or a cylinder type storage node.

In another method, a surface of a storage electrode used as a lower electrode of the capacitor is formed of so called HSG-Si (Hemispherical Grain-Silicon), which does not have a smooth morphology, but a rugged morphology, for increasing the effective area of the capacitor.

In a further method, the techniques of a three dimensional storage node and HSG-Si are combined.

A related art method for fabricating a capacitor, according to this later method, will be explained with reference to FIGS. 1A–2D. FIGS. 1A–1D illustrate sections showing the steps of a related art method for fabricating a cylindrical capacitor.

Referring to FIG. 1A, an interlayer insulating film 3 is deposited on a semiconductor substrate 1 having an impurity region 2 formed therein, and a portion of the interlayer insulating film 3 over the impurity region 2 is selectively removed to form a contact hole for a capacitor storage electrode. Then, an amorphous silicon layer 4 is deposited over the substrate 1. The amorphous silicon layer 4 is formed of an amorphous silicon doped with phosphorus at a concentration of approx. 2.0E20 atoms/cm$^3$. As shown in FIG. 1B, an oxide film 5 is deposited over the substrate 1, and subjected to photo-etching to remove portions of the oxide film 5 and leave the oxide film 5 in a region covering the contact hole. Then the patterned oxide film 5 is used as a mask in selectively removing the amorphous silicon layer 4. An amorphous silicon layer is deposited over the substrate 1, and subjected to anisotropic etching to form sidewall amorphous silicon layers 6 at sides of the oxide film 5. In this instance, the sidewall amorphous silicon layers 6 and the amorphous silicon layer 4 are connected electrically. As shown in FIG. 1C, all of the oxide film 5 is removed to form a cylindrical capacitor lower electrode 7. As shown in FIG. 1D, silicon seeds are formed on a surface of the lower electrode using a seeding gas ($Si_2H_6$ or $SiH_4$) at approx. 570~620° C. in HSG-Si forming equipment, and the silicon seeds are annealed to form HSG-Si 8 with a rugged surface. Thus, a cylindrical lower electrode with HSG-Si and a mushroom shape can be formed. Though not shown, by forming a dielectric film and an upper electrode in succession on the lower electrode, a capacitor is completed.

A related art method for fabricating a box type capacitor will now be explained. FIGS. 2A–2D illustrate sections showing the steps of a method for fabricating a box type capacitor.

Referring to FIG. 2A, an interlayer insulating film 3 is deposited on a semiconductor substrate 1 having an impurity region 2 formed therein, and a portion of the interlayer insulating film 3 over the impurity region 2 is selectively removed to form a contact hole for a capacitor storage electrode. Then, an amorphous silicon layer 4 is deposited over the substrate 1. The amorphous silicon layer 4 is formed of amorphous silicon doped with phosphorus at a concentration of approx. 2.0E20 atoms/cm$^3$. As shown in FIG. 2B, an oxide film 5 is deposited over the substrate 1. And, as shown in FIG. 2C, the oxide film 5 and the amorphous silicon layer 4 are subjected to photo-etching to remove portions of the oxide film 5 and the amorphous silicon layer 4 and leave the oxide film 5 and the amorphous silicon layer 4 in a region covering the contact hole. The oxide film 5 is then removed entirely, thereby completing a box type capacitor lower electrode 7. As shown in FIG. 2D, silicon seeds are formed on a surface of the lower electrode using a seeding gas ($Si_2H_6$ or $SiH_4$) at approx. 570~620° C. in HSG-Si forming equipment, and the silicon seeds are annealed to form HSG-Si 8 with a rugged surface. Thus, a box type lower electrode with HSG-Si and a mushroom shape can be formed. Though not shown, by forming a dielectric film and an upper electrode in succession on the lower electrode, a capacitor is completed.

However, the related art structure of a capacitor and method for fabricating a capacitor in a DRAM as explained have the following problems.

The gap between storage nodes of capacitors in the semiconductor memory, due high density device packing, is less than 0.2 μm. The HSG-Si formed on the three dimensional structure like the cylindrical structure, are liable to fall off from regions having low adhesive forces, and are subsequently seized between the storage nodes without being removed even in a subsequent cleaning process. The dislodged HSG-Si form bridges which electrically short adjacent nodes. The dislodged HSG-Si typically has fallen off from peak points (end points in the cylindrical form) in the lower electrode. That is, the weak connection of the HSG-Si coming from lack of the amorphous silicon required for formation of the HSG-Si due to a relatively thin amorphous silicon, results in the falling off or hanging down of the HSG-Si during cleaning or high temperature processes, and causes a bridge between adjacent nodes.

Second, the HSG-Si in the case of box type capacitor are also liable to fall off from edges thereof to cause bridges between adjacent nodes.

SUMMARY OF THE INVENTION

Accordingly, the present invention is directed to a structure of a lower electrode of a capacitor and a method for fabricating the same that substantially obviates one or more of the problems due to limitations and disadvantages of the related art.

An object of the present invention is to provide a structure of a lower electrode of a capacitor and a method for fabricating the same, in which formation of HSG-Si at peak points of a cylindrical type lower electrode and edges of a box type lower electrode are prevented to inhibit the formation of These and other objectives are achieved by providing a structure of a capacitor, comprising: a lower electrode having sides; and HSG-Si formed at sides of the lower electrode except upper portions of the sides.

These and other objectives a further achieved by providing a method for fabricating a capacitor, comprising: forming a lower electrode of a capacitor over a substrate, the lower electrode having lateral surfaces; adding impurity ions to upper portions of the lateral surfaces; and forming HSG-Si on surfaces of the lower electrode except the upper portions of the lateral surfaces.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 3A–3E illustrate sections showing the steps of a method for fabricating a cylindrical capacitor in accordance with a first embodiment of the present invention.

Figure 1A:
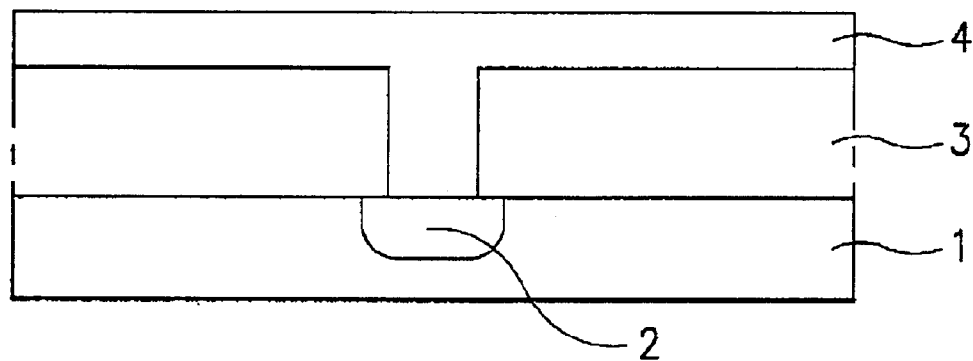
FIGS. 1A–1D illustrate sections showing the steps of a related art method for fabricating a cylindrical capacitor.
Figure 1B:
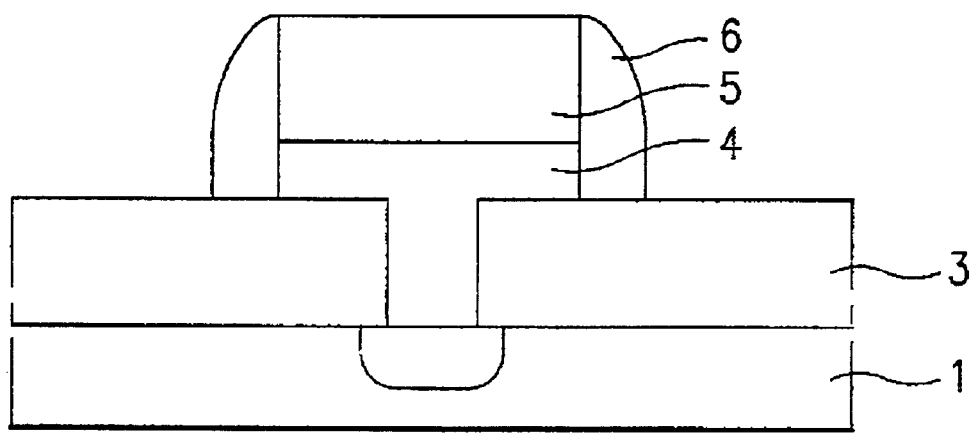
Figure 1C:
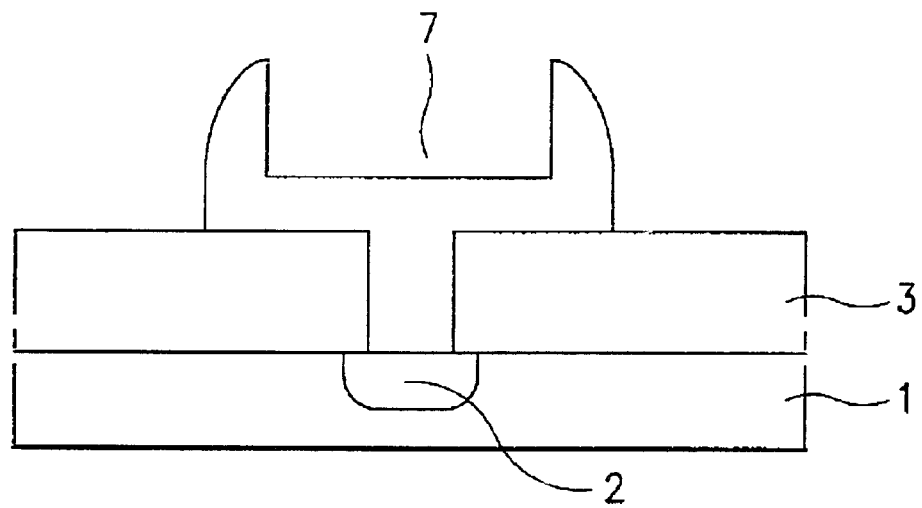
Figure 1D:
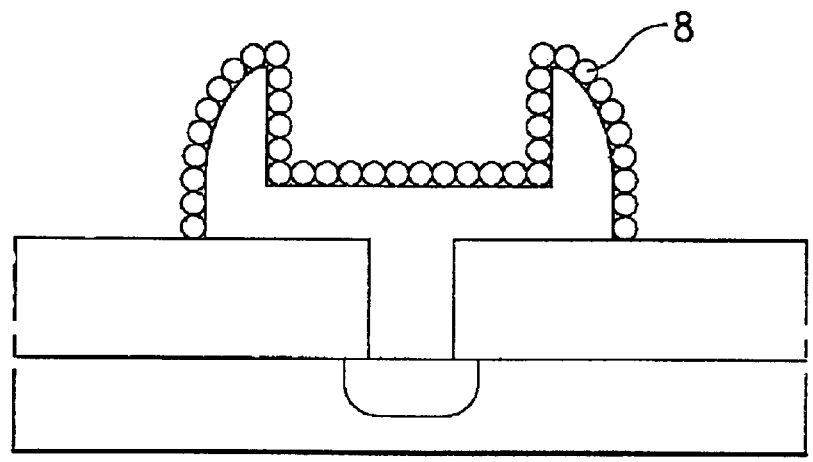
Figure 2A:
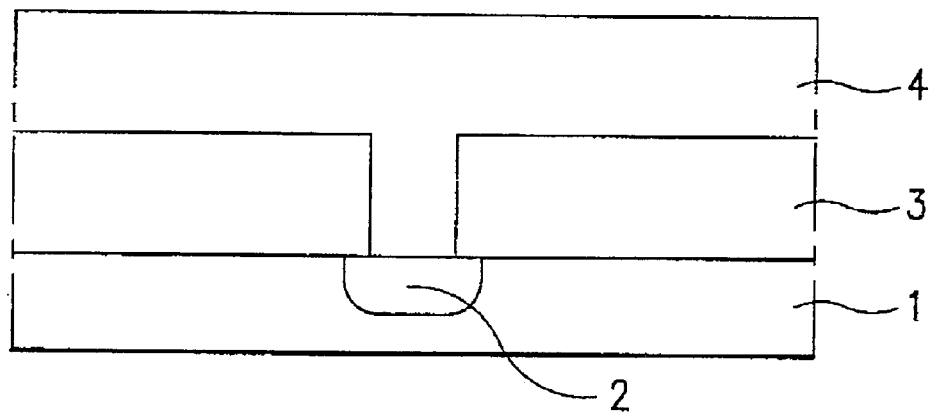
FIGS. 2A–2D illustrate sections showing the steps of a related art method for fabricating a box type capacitor.
Figure 2B:
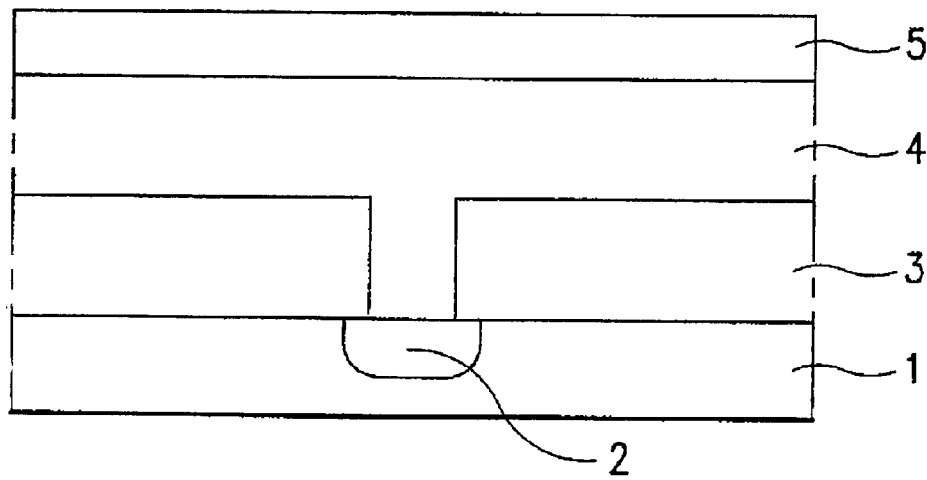
Figure 2C:
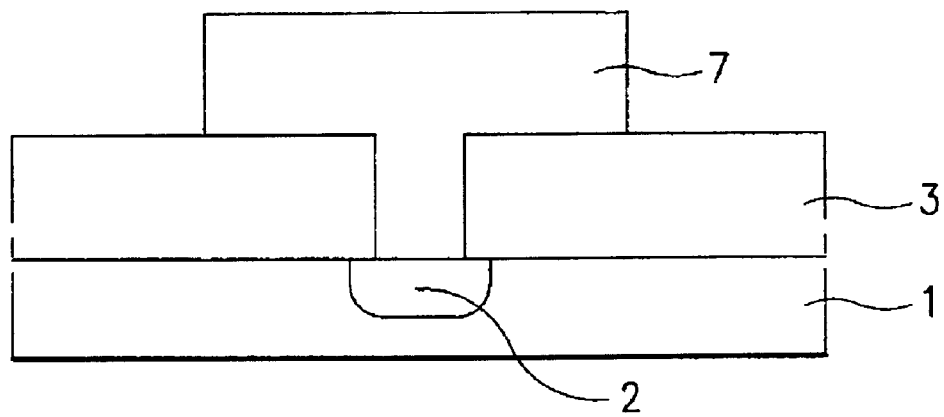
Figure 2D:
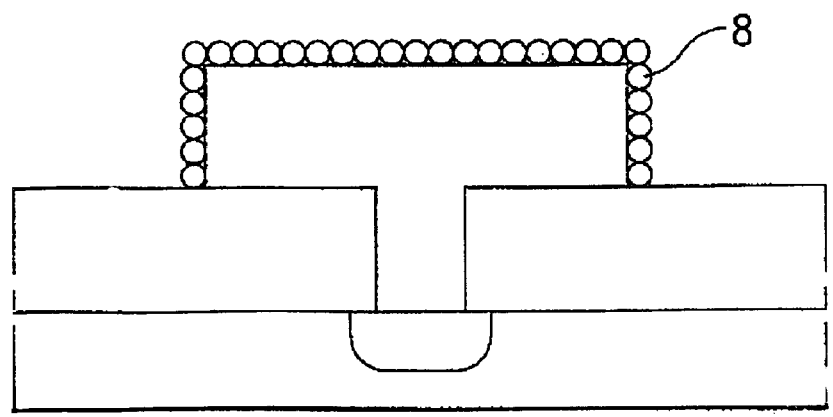
Figure 3A:
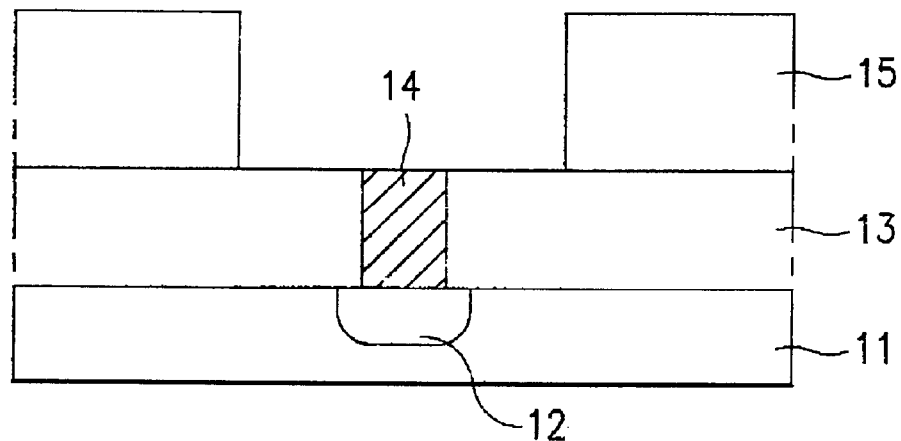
FIGS. 3A–3E illustrate sections showing the steps of a method for fabricating a cylindrical capacitor in accordance with a first embodiment of the FIGS. 4A–4E illustrate sections showing the steps of a method for fabricating a box type capacitor in accordance with a second embodiment of the present invention.
Figure 3B:
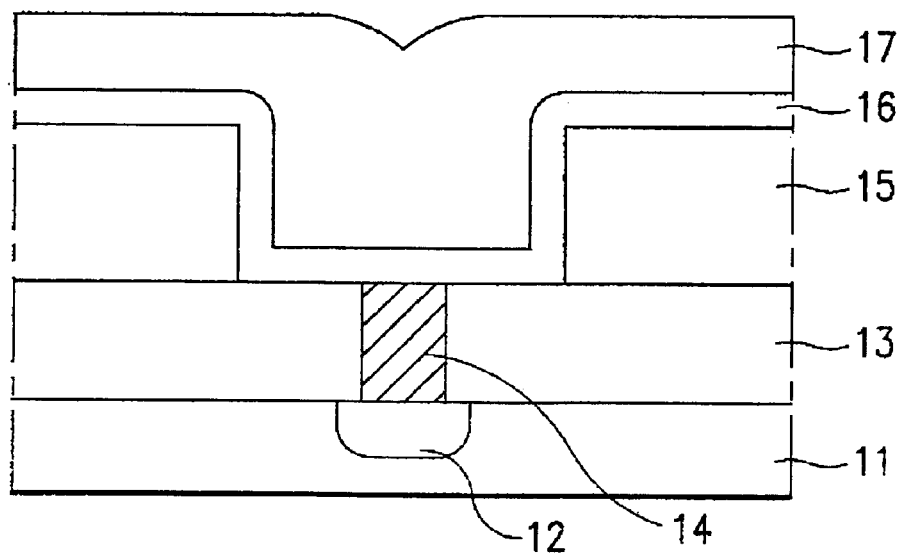
Figure 3C:
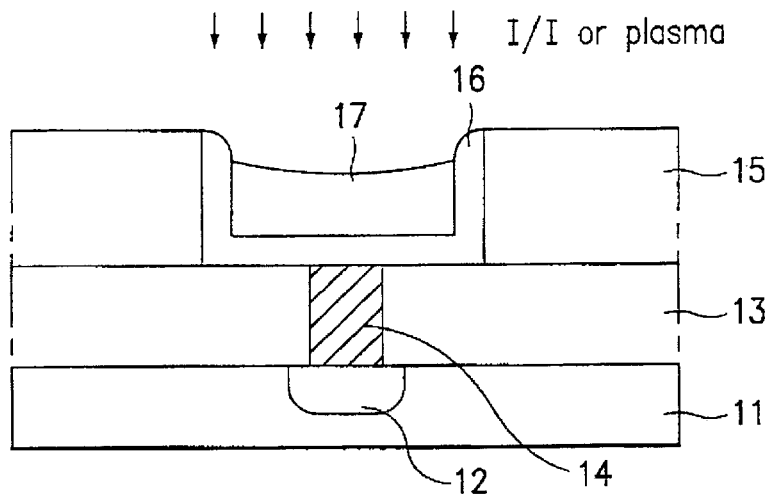

Referring to FIG. 3A, a first interlayer insulating film 13 is deposited on a semiconductor substrate 11 having an impurity region 12 formed therein, and a portion of the interlayer insulating film 13 over the impurity region 12 is selectively removed, to form a contact hole for a capacitor storage electrode. Then, a conductive plug 14 is formed in the contact hole, and a second interlayer insulating film 15 is formed over the substrate 11. A portion of the second interlayer insulating film 15 in a capacitor formation region is selectively removed. As shown in FIG. 3B, a thin amorphous silicon layer 16 is deposited over the substrate 11 to a thickness of 500~1000 Å. A planarizing insulating film 17, such as SOG (Silicon On Glass), is deposited on the amorphous silicon layer 16. The amorphous silicon layer 16 is formed of an amorphous silicon doped with phosphorus at a concentration of approx. 2.0E20 atoms/cm$^2$. As shown in FIG. 3C, the planarizing insulating film 17 and the amorphous silicon layer 16 are etched back until a surface of the second interlayer insulating film 15 is exposed.

These processes form a cylindrical lower electrode. N-Type dopant, such as phosphorus (P) or arsenic (As) is injected by a high current ion injection method into exposed portions (peak points) of the lower electrode at a dose over $1 \times 10^{15}$ atoms/cm$^2$ using the second interlayer insulating film 15 and the planarizing insulating film 17 as masks. Alternatively, without ion injecting the dopant as shown in FIG. 3C, the exposed portions (peak points) of the amorphous silicon layer 16 may be doped with phosphorus (P) using plasma at a temperature (below 600° C.) such that no crystallization of the amorphous silicon occurs (HSG-Si cannot be formed later if the amorphous silicon of the lower electrode is crystallized). Again, the second interlayer insulating film 15 and the planarizing insulating film 17 are used as masks.

Figure 3D:
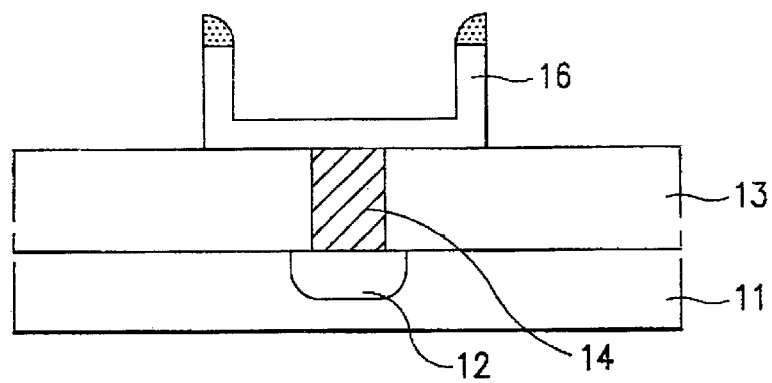
Figure 3E:
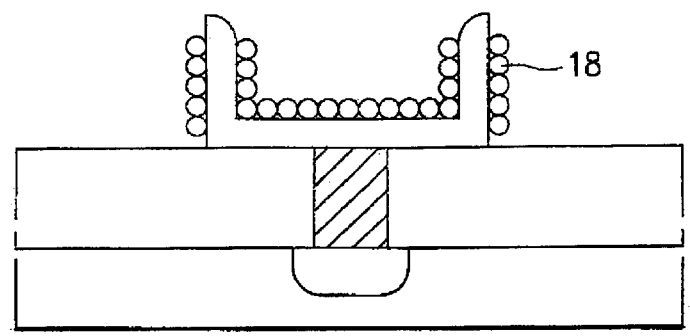

As shown in FIG. 3D, the planarizing insulating film 17 and the second interlayer insulating film 15 are removed. As shown in FIG. 3E, silicon seeds are formed on a surface of the lower electrode using a seeding gas ($Si_2H_6$ or $SiH_4$) at approx. 570–620° C. in HSG-Si forming equipment, and the silicon seeds are annealed to form HSG-Si 18 with a rugged surface. As the peak points are doped or have dopant ions injected thereto, HSG-Si is formed other than at the peak points. Though not shown, by forming a dielectric film and an upper electrode in succession on the lower electrode, a capacitor is completed.

A method for fabricating a box type capacitor in accordance with a second embodiment of the present invention will now be explained. FIGS. 4A–4E illustrate sections showing the steps of a method for fabricating a box type capacitor lower electrode in accordance with a second embodiment of the present invention.

Figure 4A:
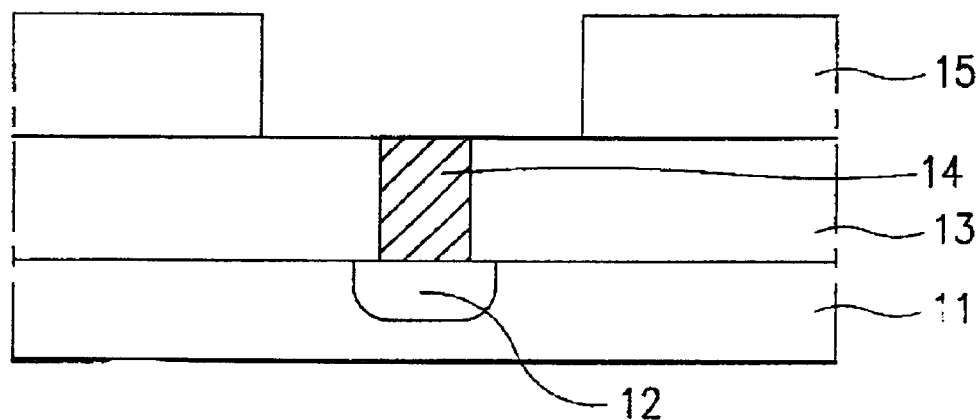
Figure 4B:
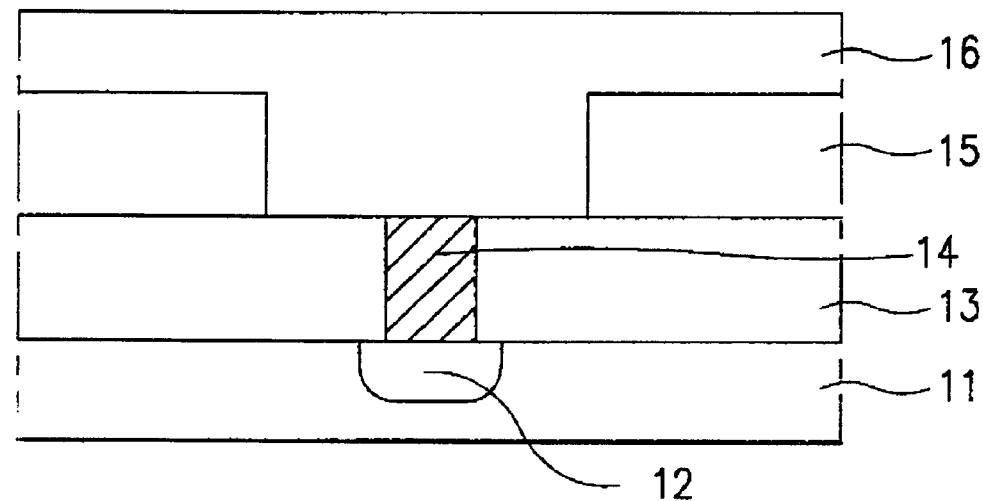
Figure 4C:
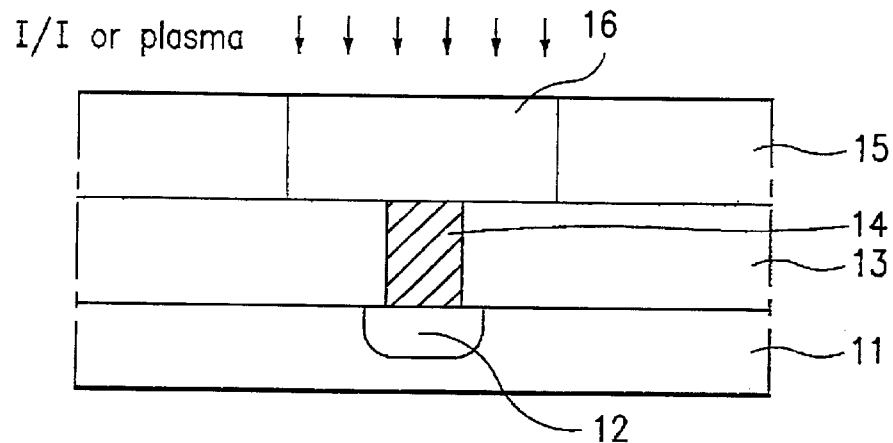

Referring to FIG. 4A, a first interlayer insulating film 13 is deposited on a semiconductor substrate 11 having an impurity region 12 formed therein, and a portion of the interlayer insulating film 13 over the impurity region 12 is selectively removed to form a contact hole for a capacitor storage electrode. Then, a conductive plug 14 is formed in the contact hole, and a second interlayer insulating film 15 is formed over the substrate 11. A portion of the second interlayer insulating film 15 in a capacitor formation region is selectively removed. As shown in FIG. 4B, a thick amorphous silicon layer 16 is deposited over the substrate 11. The amorphous silicon layer 16 is formed of an amorphous silicon doped with phosphorus at a concentration of approx. 2.0E20 atoms/cm$^2$. As shown in FIG. 4C, the amorphous silicon layer 16 is etched back until a surface of the second interlayer insulating film 15 is exposed to form a box type capacitor lower electrode. N-type dopant, such as phosphorus (P) or arsenic (As) is injected by a high current ion injection method into an exposed upper surface of the lower electrode at a dose over $1 \times 10^{15}$ atoms/cm$^2$ using the second interlayer insulating film 15 as a mask. Alternatively, without ion injecting the dopant as shown in FIG. 4C, the exposed upper surface may be doped with phosphorus (P) using plasma at a temperature (below 600° C.) such that no crystallization of the amorphous silicon occurs. Again the second interlayer insulating film 15 is used as a mask.

Figure 4D:
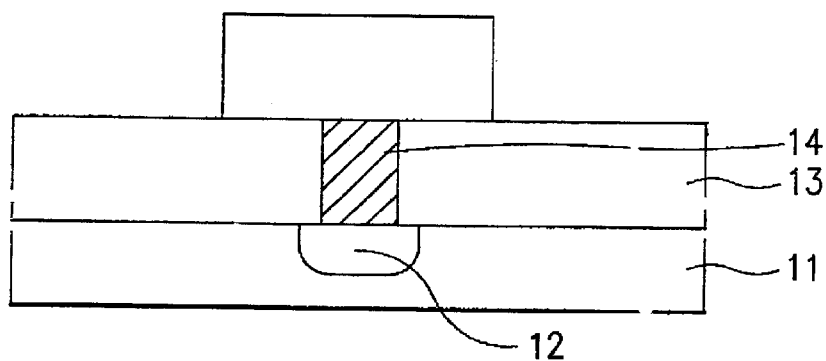
Figure 4E:
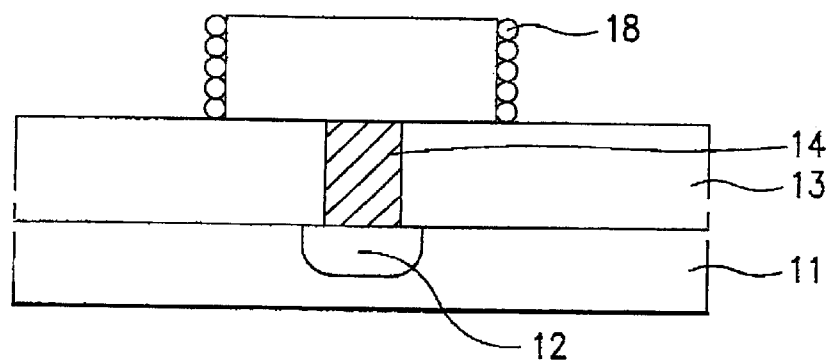

As shown in FIG. 4D, the second interlayer insulating film 15 is removed. As shown in FIG. 4E, silicon seeds are formed on a surface of the lower electrode using a seeding gas ($Si_2H_6$ or $SiH_4$) at approx. 570–620° C. in HSG-Si forming equipment and, the silicon seeds are annealed to form HSG-Si 18 with a rugged surface. In this instance, as edges are doped more if the upper surface of the lower electrode is doped or has dopant ions injected therein, HSG-Si 18 is formed other than at the upper portions of the sides of the amorphous silicon layer 16, while the upper surface may have HSG-Si formed, slightly. Though not shown, by forming a dielectric film and an upper electrode in succession on the lower electrode, a capacitor is completed.

Figure 5:
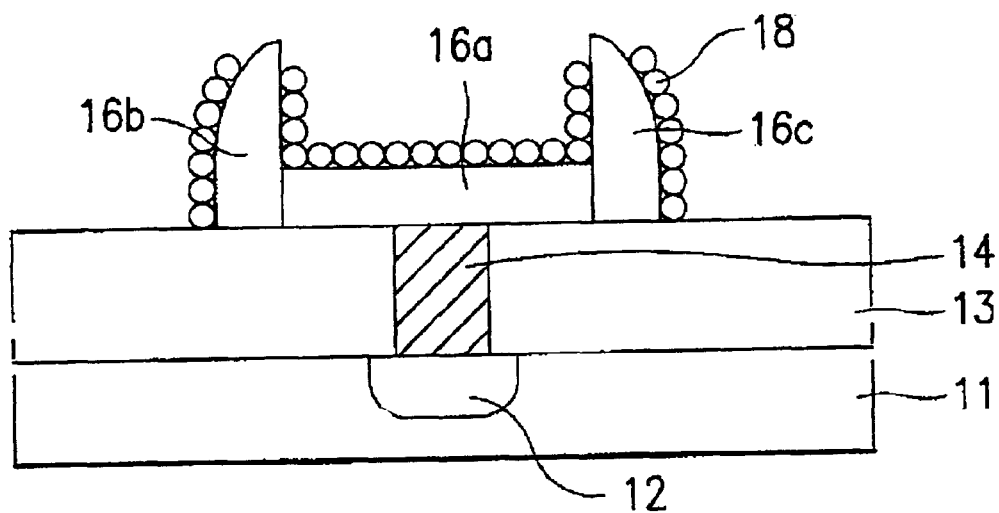
FIG. 5 illustrates a section of a lower electrode of a capacitor in accordance with a first embodiment of the present invention; and, FIG. 6 illustrates a section of a lower electrode of a capacitor in accordance with a second embodiment of the present invention.

Structures of the capacitors fabricated according to the aforementioned methods will be explained. FIG. 5 illustrates a section of a lower electrode of a capacitor in accordance with a first embodiment of the present invention, and FIG. 6 illustrates a section of a lower electrode of a capacitor in accordance with a second embodiment of the present invention.

Referring to FIG. 5, the structure of the lower electrode of a capacitor in accordance with a first embodiment of the present invention includes an interlayer insulating film 13 formed on a semiconductor substrate 11 having an impurity region 12 formed therein, which interlayer insulating film 13 has a contact hole to the impurity region 12. There is a, conductive plug 14 formed in the contact hole. There is a lower electrode 16a horizontally disposed on the interlayer insulating film 13 including the plug 14 so as to be electrically connected to the plug 14, and vertically projecting lower electrodes 16b and 16c are formed at both sides of the horizontally disposed lower electrode 16a, so as to be electrically connected to, and having a height higher than the horizontally disposed lower electrode 16a. Top portions of the vertically projecting lower electrodes 16b and 16c have impurity ions either injected therein or are doped, and surfaces of the lower electrodes 16a, 16b, and 16c have HSG-Si 18 formed thereon except top portions of the vertically projecting lower electrodes 16b and 16c.

Figure 6:
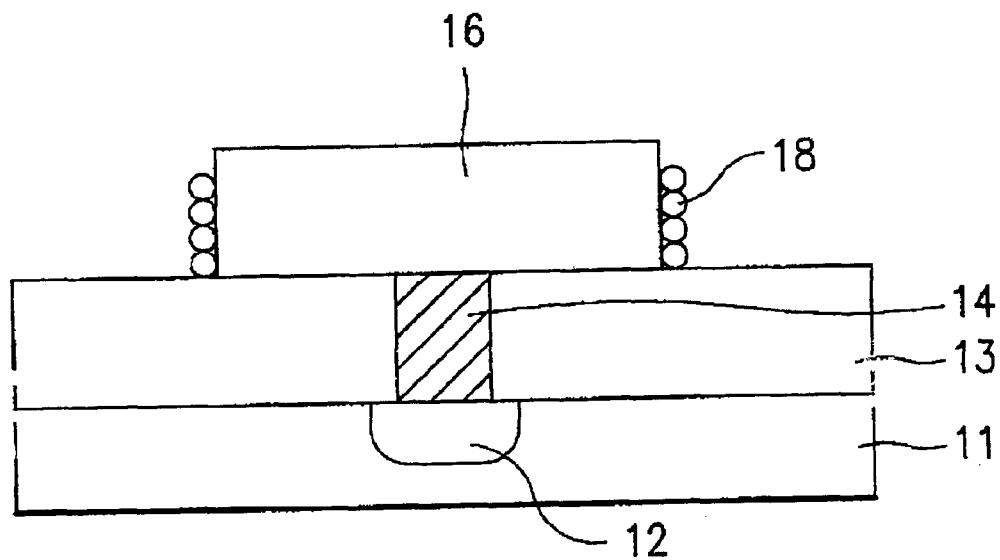

Referring to FIG. 6, the structure of the lower electrode of a capacitor in accordance with a second embodiment of the present invention includes an interlayer insulating film 13 formed on a semiconductor substrate 11 having an impurity region 12 formed therein, which interlayer insulating film 13 has a contact hole to the impurity region 12. There is a conductive plug 14 formed in the contact hole. There is a lower electrode 16 formed on the interlayer insulating film 13 including the plug 14 so as to be electrically connected to the plug 14. A top portion of the lower electrode 16 has impurity ions either injected therein or is doped, and surfaces of the lower electrodes 16 have HSG-Si 18 formed thereon except edges of the lower electrode 16 and only slightly on the top surface of the lower electrode 16.

The structure of a lower electrode of a capacitor and a method for fabricating the same of the present invention have the following advantages.

First, by preventing the formation of HSG-Si at peak points of the cylindrical lower electrode the occurrence of bridges between nodes caused by fall off of the HSG-Si is prevented, thereby improving a yield of the DRAM.

Second, preventing the formation of HSG-Si at edges of the box type lower electrode also prevents the occurrence of bridges between nodes caused by fall off of the HSG-Si, thereby improving a yield.

It will be apparent to those skilled in the art that various modifications and variations can be made in the structure of a capacitor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor, comprising:

forming a lower electrode of a capacitor over a substrate, the lower electrode having lateral surfaces;

adding impurity ions to selected upper portions of the lateral surfaces, said selected upper portions consisting of exposed surfaces having an orientation that is less than 85° degrees with respect to a horizontal line; and forming HSG-Si on all surfaces of the lower electrode except said selected upper portions of the lateral surfaces.

2. The method of claim 1, further comprising:

forming a dielectric film and an upper electrode in succession on the lower electrode including the HSG-Si.

3. The method of claim 1, wherein the adding step injects N type impurities into at least a portion of an upper surface of the lower electrode by a high current ion injection method.

4. The method of claim 3, wherein phosphorus(P) or arsenic(As) is injected at a dose of $1 \times 10^{15}$ atom/cm$^2$ in the impurity ion injection.

5. The method of claim 1, wherein the adding step dopes at least a portion of an upper surface of the lower electrode using plasma at a low temperature.

6. The method of claim 5, wherein the adding step dopes the lower electrode with phosphorous.

7. The method as claimed in claim 1, wherein the forming HSG-Si step comprises:

forming silicon seeds on the lower electrode at 570~620° C. using $Si_2H_6$ or $SiH_4$ gas; and heat treating the silicon seeds.

8. The method of claim 1, wherein the lower electrode is formed of amorphous silicon doped with phosphorus at a concentration below 2.0E20 atoms/cm$^3$.

9. The method of claim 8, wherein the amorphous silicon is deposited to a thickness of 500~1000 A.

10. The method of claim 1, wherein the forming a lower electrode step forms the lower electrode having vertically projecting electrodes formed on both sides of a lower electrode horizontally disposed on an interlayer insulating film and a contact plug and having a height higher than the lower electrode horizontally disposed.

11. The method of claim 10, wherein the adding step adds impurities to upper portions of the vertically projecting electrodes.

12. The method of claim 1, wherein the forming a lower electrode step forms a box-shaped lower electrode.

13. The method of claim 12, wherein the adding step adds the impurities to an upper surface of the box-shaped lower electrode.

* * * * *